United States Patent
Kinsman

[19]

[11] Patent Number: 6,133,068
[45] Date of Patent: Oct. 17, 2000

[54] INCREASING THE GAP BETWEEN A LEAD FRAME AND A SEMICONDUCTOR DIE

[75] Inventor: Larry D. Kinsman, Boise, Id.

[73] Assignee: Micron Technology, Inc., Boise, Id.

[21] Appl. No.: 09/264,353

[22] Filed: Mar. 8, 1999

Related U.S. Application Data

[62] Division of application No. 08/944,743, Oct. 6, 1997, Pat. No. 6,005,286.

[51] Int. Cl.⁷ .......................... H01L 21/50; H01L 21/48; H01L 21/44
[52] U.S. Cl. .................. 438/118; 438/115; 438/123; 438/124; 438/126; 438/127
[58] Field of Search ........................ 438/115, 118, 438/123, 124, 126, 127

[56] References Cited

U.S. PATENT DOCUMENTS

| | | | |
|---|---|---|---|
| 4,984,059 | 1/1991 | Kubota et al. | 357/68 |
| 5,260,234 | 11/1993 | Long | 438/123 |
| 5,436,410 | 7/1995 | Jain et al. | 174/256 |
| 5,585,600 | 12/1996 | Froebel et al. | 257/666 |
| 5,677,566 | 10/1997 | King et al. | 257/666 |
| 5,789,803 | 8/1998 | Kinsman | 257/666 |
| 6,005,286 | 8/1998 | Kinsman | 257/669 |

FOREIGN PATENT DOCUMENTS

| | | | |
|---|---|---|---|
| 6-29335 | 2/1994 | Japan | 257/666 |

*Primary Examiner*—John F. Niebling
*Assistant Examiner*—Alexander G. Ghyka
*Attorney, Agent, or Firm*—Trop, Pruner & Hu, P.C.

[57] ABSTRACT

Apparatus and method of increasing the distance of the gap between a lead frame and a semiconductor die surface in a package assembly. An adhesive layer and a gap increasing layer are disposed between the lead frame and the semiconductor die surface. The gap increasing layer has a thickness selected to reduce likelihood of package particles from being trapped between the lead frame and the die surface. The gap increasing layer includes silver plating, and has a thickness of at least about 300 to 500 microinches.

11 Claims, 5 Drawing Sheets

INCREASING THE GAP BETWEEN A LEAD FRAME AND A SEMICONDUCTOR DIE

This is a divisional of commonly assigned U.S. patent application Ser. No. 08/944,743, entitled "INCREASING THE GAP BETWEEN A LEAD FRAME AND A SEMICONDUCTOR DIE," filed Oct. 6, 1997 now U.S. Pat. No. 6,005,286.

BACKGROUND

The invention relates to increasing the gap between a lead frame and a semiconductor die.

The use of "leads over chip" (LOC) semiconductor die assemblies has become relatively common in the semiconductor industry. Referring to FIGS. 1A and 1B, a packaged LOC assembly 60 includes lead fingers 112 extending over portions of the active surface 116 of a die 102. The die surface 116 is adhered to the lead fingers 112 using adhesive layers 114, such as tape, screen print, or spin-on adhesive dielectric layers disposed between the underside of the lead fingers and the die surface. Adhesive dielectric layers can be made of a polyimide film or an adhesive tape such as KAPTON™ tape, a trademark of DuPont.

Bond wires 106 (typically gold, although aluminum and other metal alloys have been used) extend between corresponding bond sites 108 on lead ends 122 and bond pads 110 on the active die surface 116. Alternatively, the conductive connections between the die 102 and the lead extensions 112 may be made by tape automated bonding (TAB), whereby the lead ends are bonded directly to bond pads 110 by methods known in the art.

The most common manner of forming a plastic package around a die assembly is by molding, more specifically transfer molding. In this process, a semiconductor die is suspended by its active surface from the underside of lead fingers of a lead frame (typically copper or an alloy) by an adhesive layer, as illustrated in FIGS. 1A and 1B. After the bond pads of the die and the lead ends of the frame are electrically connected by bond wires, the resulting LOC die assembly is placed in a mold cavity and encapsulated in a thermal setting polymer which, when heated, reacts to form the final packaging material 134, which is a highly cross-linked matrix no longer capable of being re-melted. The packaged die assembly may be a dual-in-line package (DIP), zigzag-in-line package (ZIP), small outline J-lead package (SOJ), quad flat-pack (QFP), plastic leaded chip carrier (PLCC), surface mount device (SMD), or other plastic package configuration.

The thermal setting polymer generally includes three major components: an epoxy resin, a hardener (including accelerators), and a filler material. Filler materials usually include a form of fused silica, although other materials such as calcium carbonates, calcium silicates, talc, mica, and clays have also been used. Powdered fused quartz is an example of a filler used in encapsulants. The filler materials are relatively hard, particularly when compared to the die surface 116.

Fillers are used to reinforce the polymer to provide additional package strength, to enhance thermal conductivity of the package, to provide enhanced resistance to thermal shock, to reduce the coefficient of thermal expansion of the composite material, and to reduce the cost of the encapsulating material as compared to unfilled polymer.

The filler material includes small filler particles 130 (typically between 75 and 125 micrometers or $\mu$m). Some of the filler particles 130 can be trapped in a gap 126 (FIG. 1B) between the underside of the lead finger 112 and the die surface 116. The trapped hard filler particles may place the active die surface 116 under residual stress at the points of contact of the particles. The particles may then damage the die surface 116 or conductive elements thereon when the package is further stressed (mechanically, thermally, or electrically) during post-capsulation handling and testing.

One method of reducing stress to the die surface due to trapped mold compound particles is described in U.S. patent application Ser. No. 08/857,200, now U.S. Pat. No. 5,923,081 entitled "Compression Layer on the Leadframe to Reduce Stress Defects," filed May 15, 1997, and having the same assignee as the present application. As shown in FIG. 2, a packaged LOC assembly includes a stress relief layer 140 that is attached to the under surface 128 of the lead finger 112. The material of the stress relief layer 140 may be a soft metal such as silver or other relatively inert metal, or an alloy thereof having generally low hardness, including pure metals such as palladium and platinum and their alloys. The thickness of the stress relief layer 140 is generally about 1 to 5 $\mu$m (or about 39 to 197 microinches), which is sufficient to allow relatively deep penetration by filler particles 130. Alternatively, the soft material of the stress relief layer 140 may be a polymer designed to have a low hardness, including epoxies, polyimides, acrylics, and silicones. The stress relief layer 140 extends from the outer edge 138 of the adhesive layer 114 to the outer edge 136 of the die 102 or beyond, such that the outer edge 124 of the stress relief layer 140 extends to or past the edge 136 of the die 102. Damage to the die surface 116 is reduced since any trapped particles 130 will preferentially penetrate the soft material layer 140.

Another method of reducing stress to the die surface due to trapped particles is described in U.S. patent application Ser. No. 08/614,618, entitled "Stress Reduction Feature for LOC Lead Frame," filed Mar. 13, 1996 and also having the same assignee as the present application. As shown in FIG. 3, the packaged LOC assembly includes a slot or recess 113 that is formed in the lead finger 112 by etching, machining, eroding, removing material with an electron beam, or by other processes known in the art to reduce the thickness of the lead finger 112 proximate the active die surface 116 between the portion of the lead end 122 attached to the adhesive 114 and the outer edge 136 of the die 102. The recess 113 creates an enlarged space 117 between the active surface 116 and the lead finger 112, thus reducing the likelihood that filler particles 130 can be trapped between the lead finger 112 and the active die surface 116.

SUMMARY

The invention may have one or more of the following advantages. A relatively simple method is provided to increase the gap between the lead frame and the active die surface to reduce stress to the die surface. The gap distance between the lead frame and the active die surface can be increased using existing process technology and without modifying the lead frame design. Stress reduction to the die surface due to trapped mold compound particles can be reduced without adding significant cost to the manufacturing process.

In general, in one aspect, the invention features a semiconductor die assembly that includes a die having an active surface and a lead frame having a lead member extending over the die active surface. An adhesive layer defined by boundary edges is attached to a portion of the die active surface, and a gap increasing layer is disposed between the adhesive layer and the lead member. The gap increasing layer is defined by boundary edges, and the boundary edges of the gap increasing layer are substantially at or within the boundary edges of the adhesive layer.

In general, in another aspect, the invention features a semiconductor device including a die having an active surface, a lead frame having a lead member extending over the active die surface, and an adhesive layer attached to a portion of the active die surface. A second layer is disposed between the adhesive layer and the lead member, and the second layer has a thickness of at least about 300 microinches.

In general, in another aspect, the invention features an apparatus for increasing the distance of a gap between a semiconductor die surface and an attached lead frame. A first layer is attached to the semiconductor die surface and a second layer is disposed between the lead frame and the first layer. The second layer has a predetermined thickness selected to reduce the likelihood of trapped particles between the lead frame and the semiconductor die.

In general, in another aspect, the invention features a semiconductor package assembly that includes a semiconductor die having an active surface and a lead frame attached to the semiconductor die. An adhesive layer is attached to the semiconductor die surface and disposed between the die surface and the lead frame. A gap increasing layer is disposed of between the adhesive layer and the lead frame. A mold compound encapsulates the assembly of the semiconductor die, the lead frame, the adhesive layer, and the gap increasing layer. The gap increasing layer has a thickness selected to reduce the likelihood of mold compound particles being trapped between the die surface and the lead frame.

In general, in another aspect, the invention features a method of manufacturing a semiconductor package assembly. The method includes attaching an adhesive layer to a portion of an active surface of a semiconductor die, and disposing a gap increasing layer between the adhesive layer and a lead frame member extending over the die active surface. The gap increasing layer has a thickness selected to reduce the likelihood of package particles being trapped between the lead frame and the semiconductor die surface.

Other features and advantages will become apparent from the following description and the claims.

DETAILED DESCRIPTION

Figure 1A:
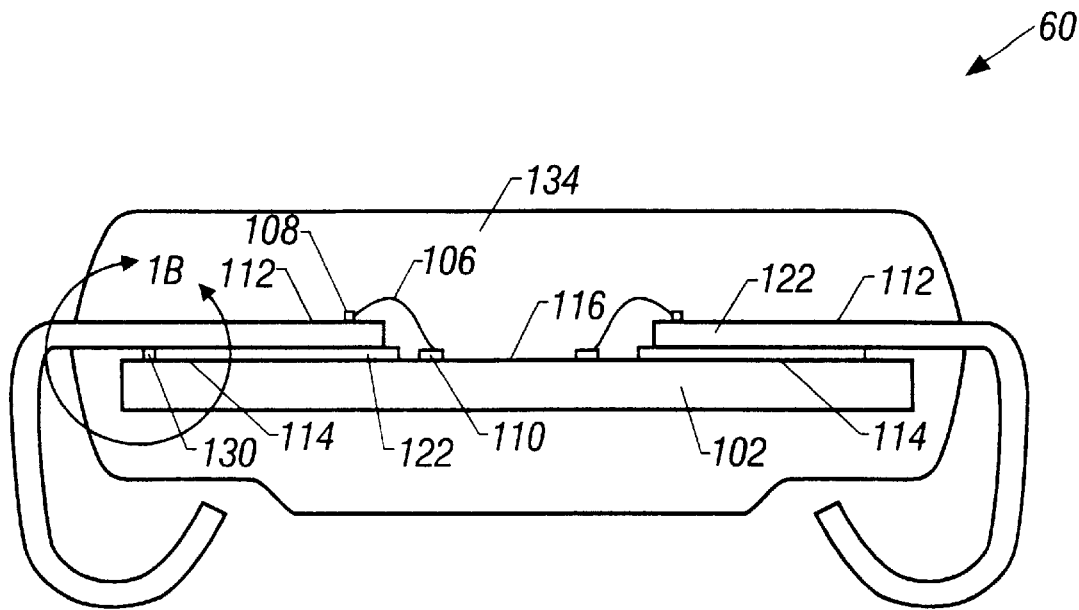
FIGS. 1A and 1B are enlarged cross-sectional diagrams of a prior art package semiconductor device.
Figure 1B:
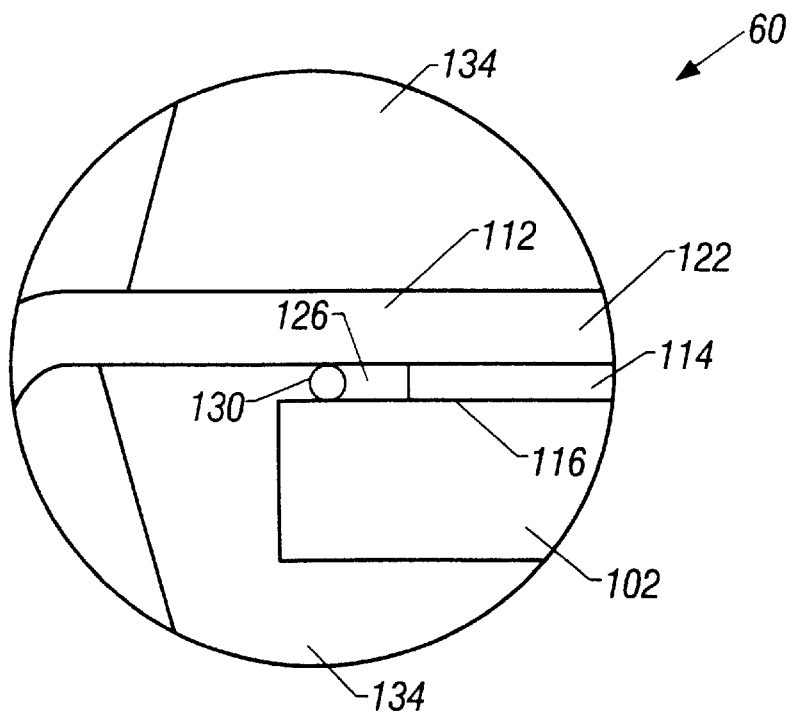
Figure 2:
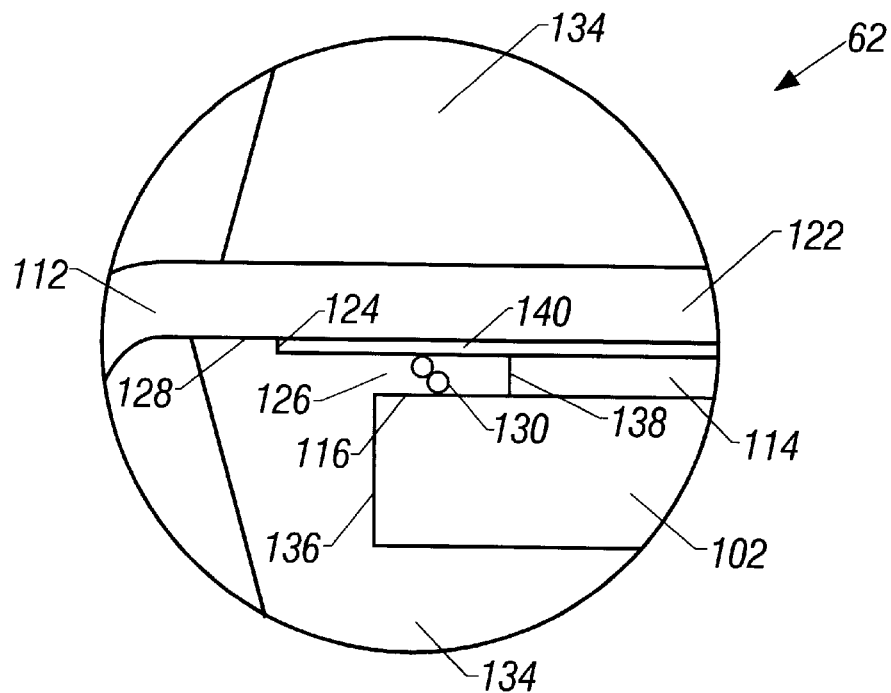
FIG. 2 is an enlarged cross-sectional diagram of a packaged semiconductor device having a soft material layer attached to the lead frame to allow penetration of a mold compound particle to reduce stress to the die surface.
Figure 3:
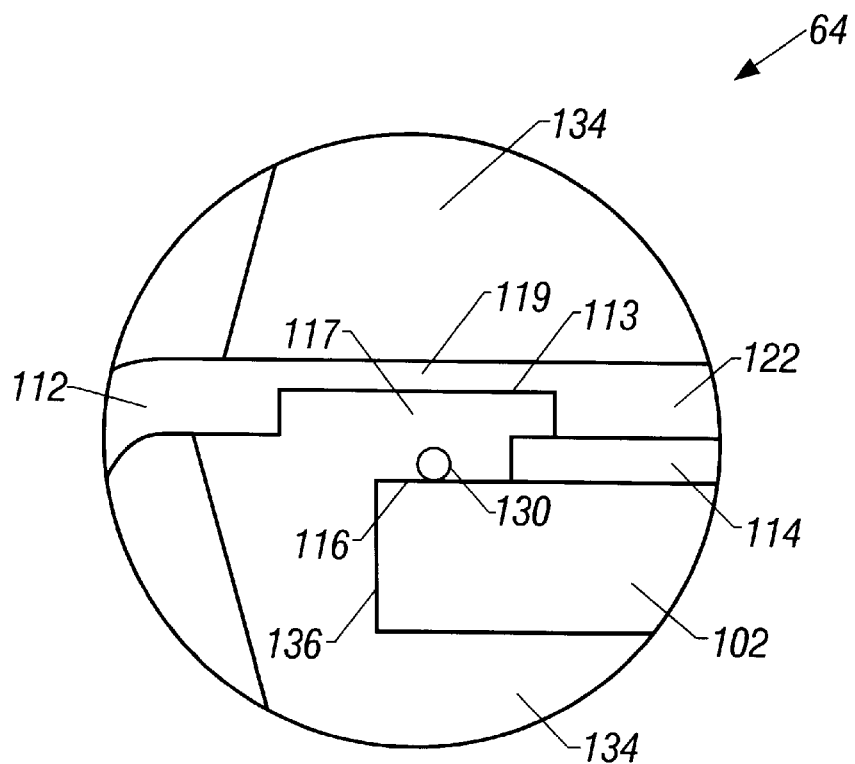
FIG. 3 is an enlarged cross-sectional diagram of a packaged semiconductor device having a lead frame in which a slot or recess is formed to increase the gap between the die surface and the lead frame.
Figure 4A:
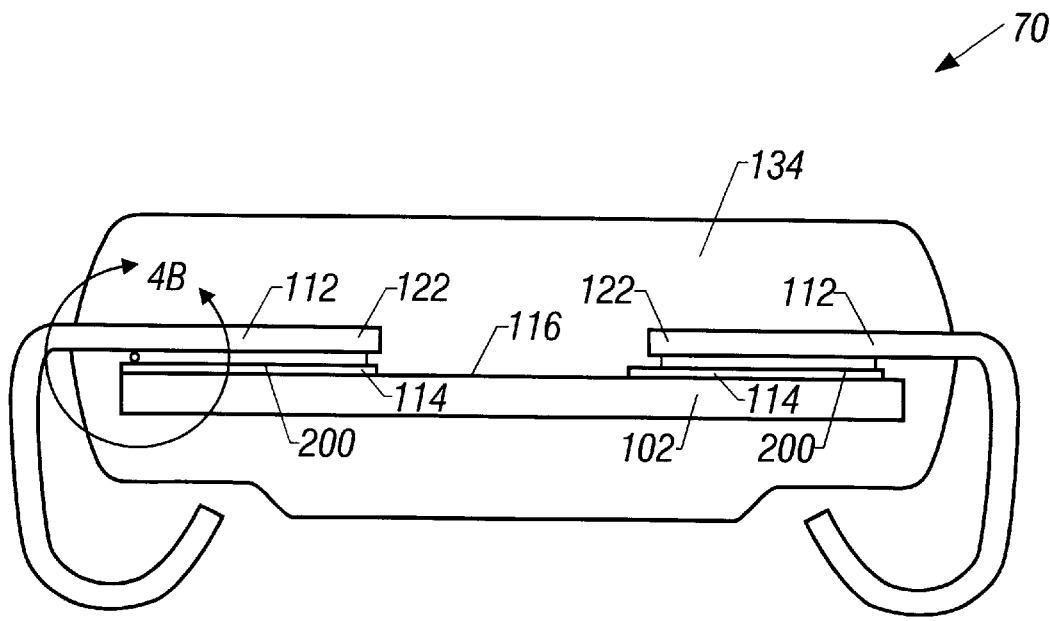
FIGS. 4A and 4B are enlarged cross-sectional diagrams of a packaged semiconductor device according to the present invention.
Figure 4B:
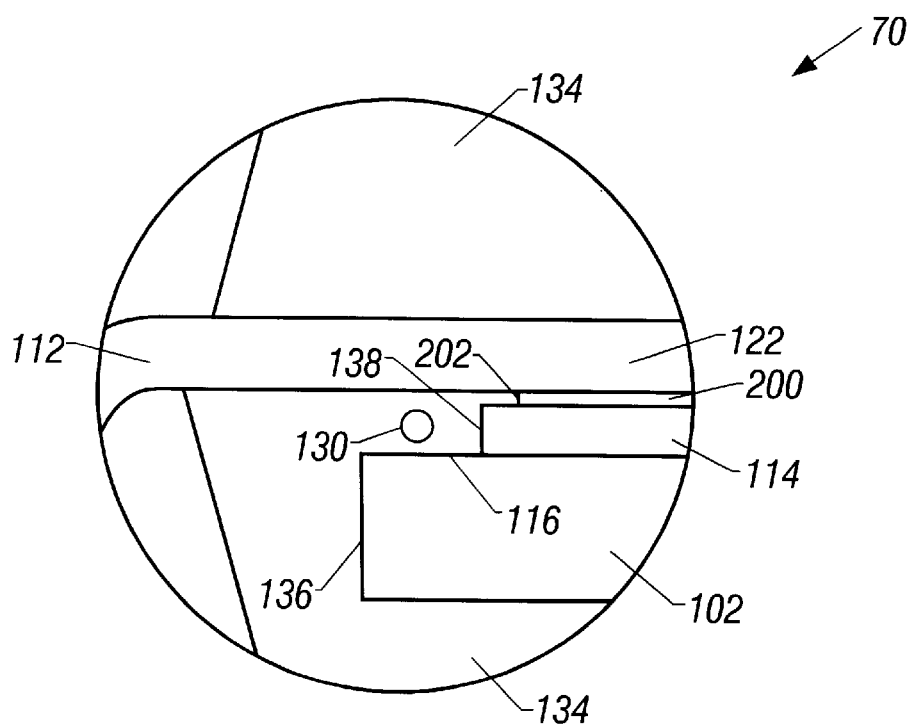

Referring to FIGS. 4A and 4B, a semiconductor device 70 includes gap increasing layers 200 disposed between the underside of the lead finger 112 and the upper surface of corresponding adhesive layers 114 (such as tape, screen print, or spin-on adhesive dielectric layers). The gap increasing layers 200 can be attached to the underside of the lead fingers 112 and have a thickness set to at least about 300 to 500 microinches (or about 7.6 $\mu$m to 12.7 $\mu$m), thereby increasing the gap distance by about the same amount. This can be effective in the reduction of trapped mold compound particles that result in stress related defects.

The outer edge 202 of each gap increasing layer 200 can be set at, or set some distance from the outer edge 138 of the adhesive layer 114. The outer edge 202 of the gap increasing layer 200 does not extend beyond the outer edge 138 of the adhesive layer 114. This avoids the condition where particles 300 may be trapped between the gap increasing layer 200 and the die surface 116.

One material that can be used for the gap increasing layer 200 is silver that is spot plated to the underside of the lead fingers. Silver is typically plated in the areas to be wire bonded and is necessary for the wire bond process. Typical lead frame materials include alloy 42, copper 194, and copper 7025.

As silver plating on the lead frame is already part of the manufacturing process of the LOC semiconductor device 70, no modification to the process technology needs to be made to spot plate the underside of the lead fingers 112 with relatively thick (e.g., greater than about 300 microinches) gap increasing layers 200. The gap increasing layers 200 are attached to portions of the underside of the lead fingers 112 that overlay the adhesive layers 114.

Aside from silver, other types of materials can be used to make the gap increasing layer 200, including polyimide, epoxy, gold, and a tin/lead composition.

Figure 5:
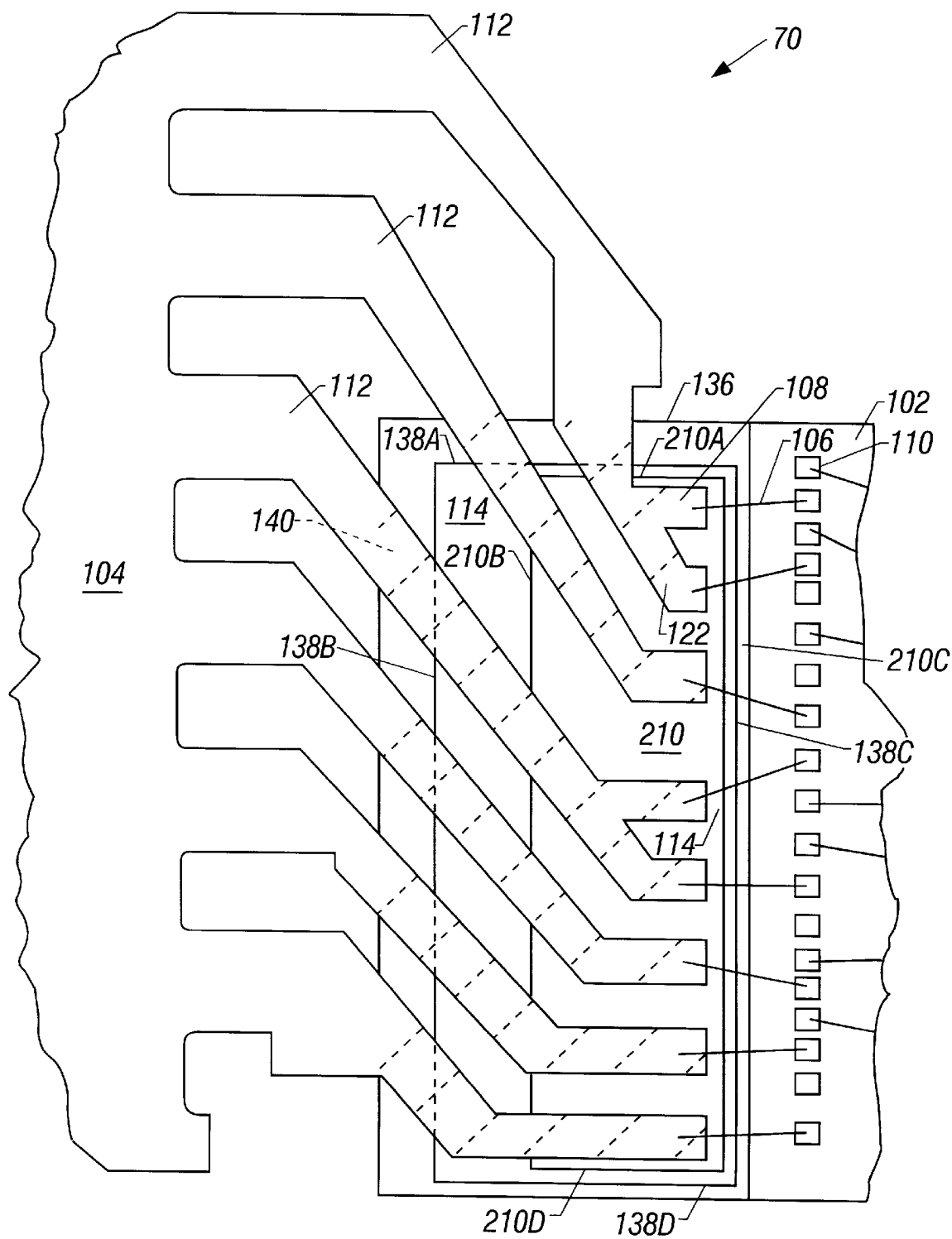
FIG. 5 is an enlarged plan view of a die lead frame assembly of a semiconductor device.

FIG. 5 shows a portion of a LOC semiconductor device including die 102 having bond pads 110 and a lead frame 104 with lead fingers 112 extending over peripheral portions of the die. Conductive bond wires 106 connect bond pads 110 with bond sites 108 on the lead ends 122. The adhesive layer 114 (generally rectangular in shape) overlays a portion of the die surface 116 underneath the lead fingers 112. In this configuration, silver (or some other material) can be spot plated to portions of the underside of the lead fingers 112. In this manner, it is ensured that edges of the gap increasing layers 200 do not extend beyond the boundary edges 138A, 138B, 138C, and 138D of the adhesive layer 114. Alternatively, a gap increasing layer 210 on which all the lead fingers 112 illustrated in FIG. 5 lay can be used, provided that the boundary edges 210A, 210B, 210C, and 210D of the gap increasing layer 210 do not extend beyond the corresponding edges 138A–D of the adhesive layer 114. However, use of such a relatively large piece of gap increasing layer 210 would require a change in the die assembly process steps.

Figure 6:
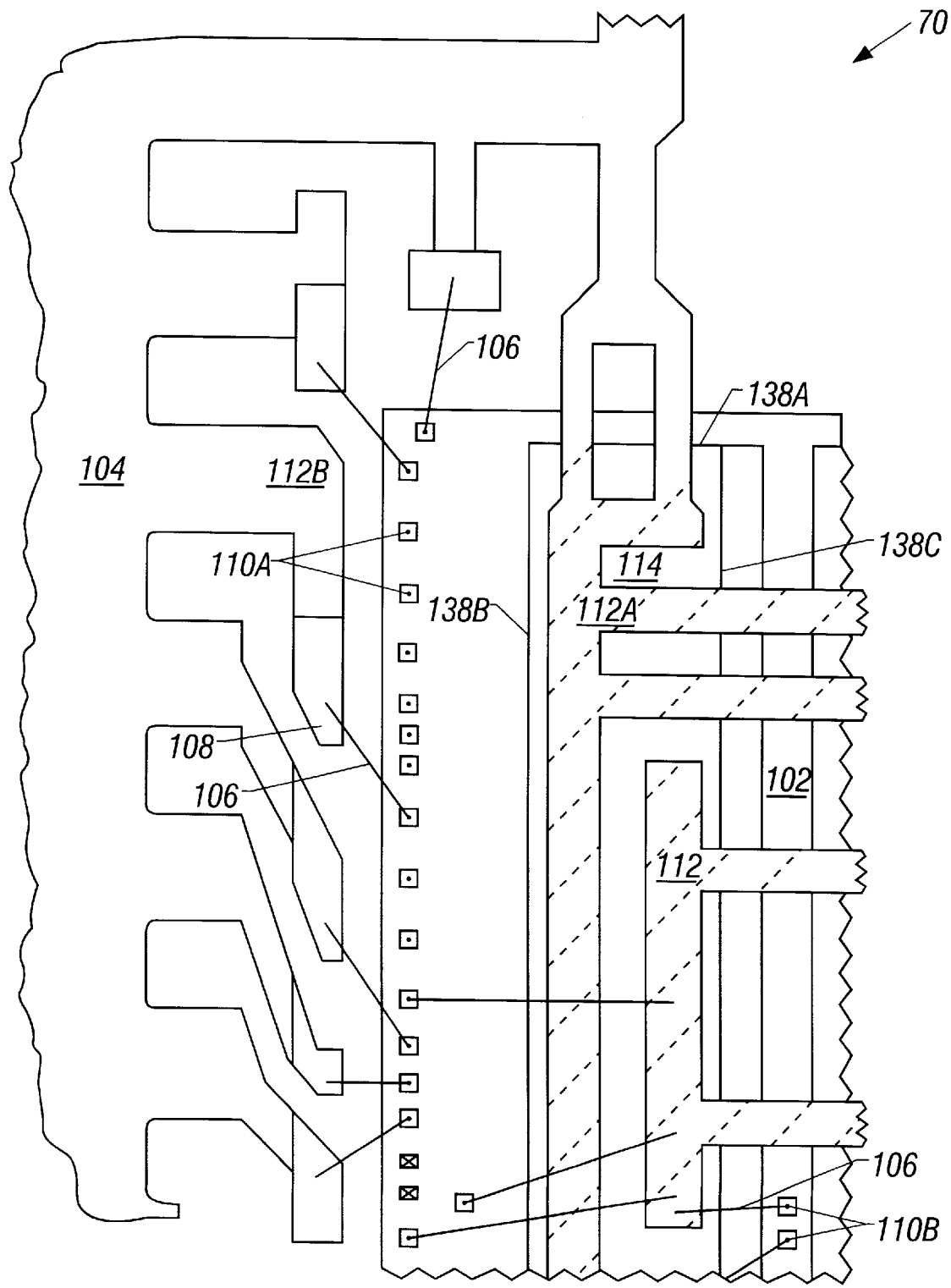
FIG. 6 is an enlarged plan view of another embodiment of a die lead frame assembly of a semiconductor device.

FIG. 6 depicts a different LOC semiconductor device in which the lead fingers 112A (typically bus bars) overlying the die 102 in the central portion of the die are connected to bond pads 110A, while leads 112B not adhered to the die are connected by wires to peripheral bond pads 110B. In this configuration, the gap increasing layer 200 can be spot plated beneath the portions of the bus bars 112A.

Other embodiments are also within the scope of the following claims. For example, the gap increasing layers can be used in lead frame assemblies different from those depicted in FIGS. 5 and 6.

What is claimed is:

1. A method of manufacturing a semiconductor package assembly, the method comprising:

disposing an adhesive layer between a portion of an active surface of a semiconductor die and a lead frame member such that a gap is defined by surfaces of the semiconductor die and the lead frame member and an edge of the adhesive layer; and disposing a gap increasing layer of a predetermined thickness between the adhesive layer and a lead frame member extending over the die active surface to reduce the likelihood of package particles being trapped in the gap.

2. The method of claim 1, wherein the disposing includes spot plating a metal to the lead frame member.

3. The method of claim 2, wherein the metal includes silver.

4. The method of claim 1, wherein the disposing includes disposing a gap increasing layer of at least 300 microinches.

5. The method of claim 1, wherein the disposing includes disposing a gap increasing layer of at least 500 microinches.

6. A method of manufacturing a semiconductor device, comprising:

attaching an adhesive layer to a portion of an active surface of a semiconductor die; and forming a gap increasing layer to space a lead frame member sufficiently above the die active surface that the likelihood that particles will be trapped in a gap defined by a surface of the lead frame, the die active surface, and an edge of the adhesive layer is reduced.

7. The method of claim 6, wherein the forming includes spot plating a metal to the lead frame member.

8. The method of claim 7, wherein the metal includes silver.

9. The method of claim 6, wherein the forming includes forming a gap increasing layer of at least 300 microinches.

10. The method of claim 6, wherein the forming includes forming a gap increasing layer of at least 500 microinches.

11. A method of fabricating a semiconductor device, comprising:

encapsulating a die and lead frame with a material having filler particles of one or more sizes;

attaching the die and lead frame using an adhesive layer such that a gap is formed between surfaces of the die and lead frame and an edge of the adhesive layer; and disposing a second layer between the lead frame and die to increase the gap by a predetermined thickness to reduce likelihood of trapped encapsulant filler particles in the gap.

* * * * *